(12) United States Patent
Kishishita et al.

(10) Patent No.: US 12,017,252 B2
(45) Date of Patent: Jun. 25, 2024

(54) VIBRATION DEVICE

(71) Applicant: Murata Manufacturing Co., Ltd., Nagaokakyo (JP)

(72) Inventors: Hiroyuki Kishishita, Nagaokakyo (JP); Kenji Kagayama, Nagaokakyo (JP); Shogo Tokoi, Nagaokakyo (JP); Kazuyuki Ikeda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 536 days.

(21) Appl. No.: 17/371,183

(22) Filed: Jul. 9, 2021

(65) Prior Publication Data

US 2021/0331206 A1  Oct. 28, 2021

Related U.S. Application Data

(63) Continuation of application No. PCT/JP2020/005583, filed on Feb. 13, 2020.

(30) Foreign Application Priority Data

Feb. 22, 2019 (JP) ................................. 2019-030108

(51) Int. Cl.
   *B06B 1/06* (2006.01)
   *H10N 30/87* (2023.01)
   *H10N 30/88* (2023.01)

(52) U.S. Cl.
   CPC ........... *B06B 1/0644* (2013.01); *H10N 30/87* (2023.02); *H10N 30/88* (2023.02)

(58) Field of Classification Search
   CPC ....... B06B 1/0644; H10N 30/87; H10N 30/88
   See application file for complete search history.

(56) References Cited

U.S. PATENT DOCUMENTS

| | | | |
|---|---|---|---|
| 7,948,153 B1 | 5/2011 | Kellogg et al. | |
| 2013/0328446 A1 | 12/2013 | Horiguchi et al. | |

(Continued)

FOREIGN PATENT DOCUMENTS

| | | | |
|---|---|---|---|
| CN | 105637898 A | 6/2016 | |
| CN | 207304408 U | 5/2018 | |

(Continued)

OTHER PUBLICATIONS

Official Communication issued in corresponding Chinese Patent Application No. 202080011038.2 mailed on Dec. 31, 2021.

(Continued)

*Primary Examiner* — Bryan P Gordon
(74) *Attorney, Agent, or Firm* — Keating & Bennett, LLP

(57) ABSTRACT

A vibration device includes a first vibration plate having a length direction, the first vibration plate including a first end portion at one end in the length direction and a second end portion at another end in the length direction, a first piezoelectric element provided on the first vibration plate, a first conductive wiring line joined to the first piezoelectric element at a position closer to the first end portion in the length direction than a center of the first vibration plate, a first fixed component connected to the first conductive wiring line, and a case component to which the first fixed component is fixed. The second end portion is a free end, and the first conductive wiring line includes a bent portion.

9 Claims, 10 Drawing Sheets

(56) References Cited

U.S. PATENT DOCUMENTS

| | | | |
|---|---|---|---|
| 2016/0170328 A1* | 6/2016 | Hosokawa | G03G 15/0858 |
| | | | 399/27 |
| 2017/0028441 A1* | 2/2017 | Kagayama | B06B 1/0644 |
| 2017/0195798 A1* | 7/2017 | Makino | H04R 1/06 |
| 2017/0371190 A1 | 12/2017 | Yamazaki et al. | |
| 2018/0131346 A1* | 5/2018 | Kagayama | H10N 30/2042 |

FOREIGN PATENT DOCUMENTS

| | | |
|---|---|---|
| JP | 03-175425 A | 7/1991 |
| JP | 09-201080 A | 7/1997 |
| JP | 2003-340371 A | 12/2003 |
| JP | 2006-270026 A | 10/2006 |
| JP | 2018-025756 A | 2/2018 |
| WO | 2012/153593 A1 | 11/2012 |
| WO | 2015/163166 A1 | 10/2015 |
| WO | 2017/130738 A1 | 8/2017 |
| WO | 2019/021815 A1 | 1/2019 |

OTHER PUBLICATIONS

Official Communication issued in International Patent Application No. PCT/JP2020/005583, mailed on Mar. 17, 2020.

* cited by examiner

VIBRATION DEVICE

CROSS REFERENCE TO RELATED APPLICATIONS

This application claims the benefit of priority to Japanese Patent Application No. 2019-030108 filed on Feb. 22, 2019 and is a Continuation Application of PCT Application No. PCT/JP2020/005583 filed on Feb. 13, 2020. The entire contents of each application are hereby incorporated herein by reference.

BACKGROUND OF THE INVENTION

1. Field of the Invention

The present invention relates to a vibration device.

2. Description of the Related Art

Various vibration devices in which a vibrator using a piezoelectric element is vibrated in a case have been proposed. For example, in Japanese Unexamined Patent Application Publication No. 9-201080, a vibrator including a piezoelectric element is provided in a case. When a piezoelectric element and a power supply component are connected by soldering, there is a problem such as solder peeling. In the vibration device described in Japanese Unexamined Patent Application Publication No. 9-201080, a power supply component includes a holding connection portion. The holding connection portion holds the vibrator and is electrically connected to the piezoelectric element.

As described in Japanese Unexamined Patent Application Publication No. 9-201080, when a power supply component is fixed to a piezoelectric element by soldering, for example, peeling may occur in the joint portion therebetween due to vibration of a vibrator. To address this, in Japanese Unexamined Patent Application Publication No. 9-201080, the power supply component includes the holding connection portion that holds the piezoelectric element. In this case, since the vibrator is held by the holding connection portion, that is, since there is no solder joint portion, for example, solder peeling is unlikely to occur.

However, such a configuration in which a holding connection portion, such as that described in Japanese Unexamined Patent Application Publication No. 9-201080, is used has restrictions on the shape of a vibrator to be held and has a problem in that the structure that holds the vibrator including a piezoelectric element is complex. In addition, the electrical connection between the holding connection portion and the piezoelectric element may be insufficient, depending on the situation in which the vibrator is vibrated.

SUMMARY OF THE INVENTION

Preferred embodiments of the present invention provide vibration devices that each have a simple structure, that each have excellent reliability of the connection between a vibration body and a terminal configured to be electrically connected to the vibration body, and in each of which, for example, peeling is unlikely to occur in the joint portion therebetween.

A preferred embodiment of the present invention provides a vibration device including a first vibration plate having a length direction, the first vibration plate including a first end portion at one end in the length direction and a second end portion at another end in the length direction, a first piezoelectric element on the first vibration plate, a first conductive wiring line joined to the first piezoelectric element at a position closer to the first end portion in the length direction than a center of the first vibration plate, a first fixed component connected to the first conductive wiring line, and a case component to which the first fixed component is fixed. The second end portion is a free end, and the first conductive wiring line includes a bent portion.

It is possible to provide vibration devices according to preferred embodiments of the present invention that are each capable of improving the reliability of the connection between a terminal and a vibration plate and in each of which, for example, peeling is unlikely to occur in the joint portion therebetween with a simple structure.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing preferred embodiments of the present invention with reference to the drawings.

It is noted that each preferred embodiment in the description is an example and configurations of different preferred embodiments can be partially replaced or combined.

Figure 1:
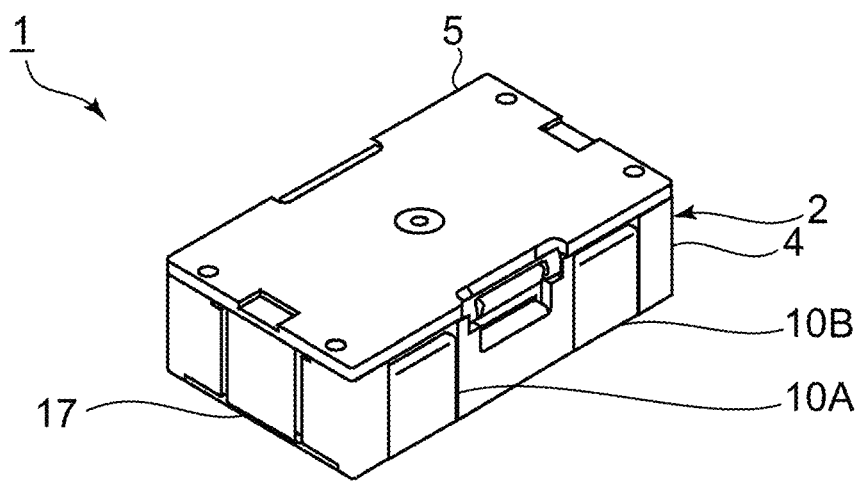
FIG. 1 is a perspective view illustrating the exterior of a vibration device according to a first preferred embodiment of the present invention.
Figure 2:
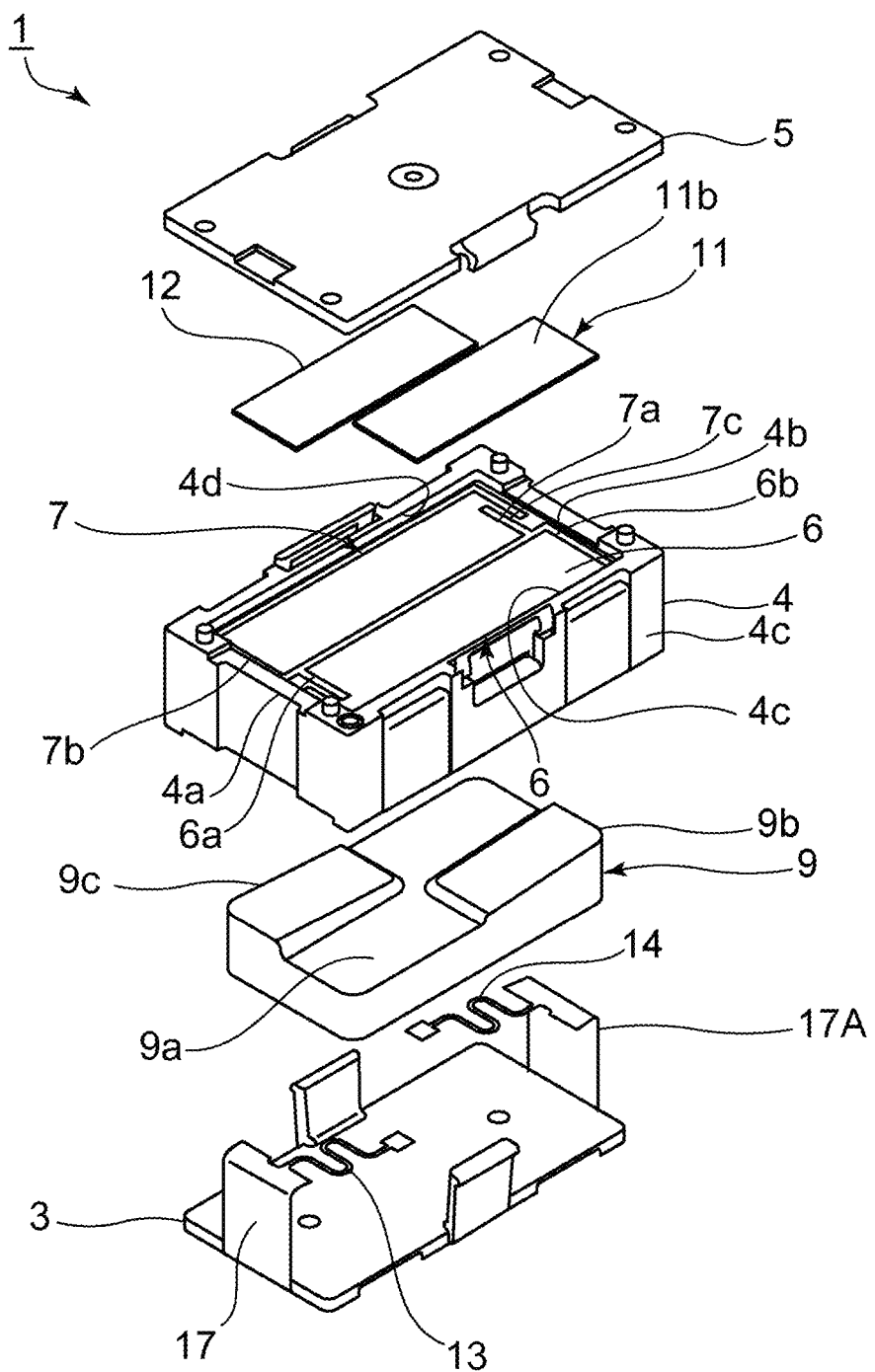
FIG. 2 is an exploded perspective view of the vibration device according to the first preferred embodiment of the present invention.
Figure 3:
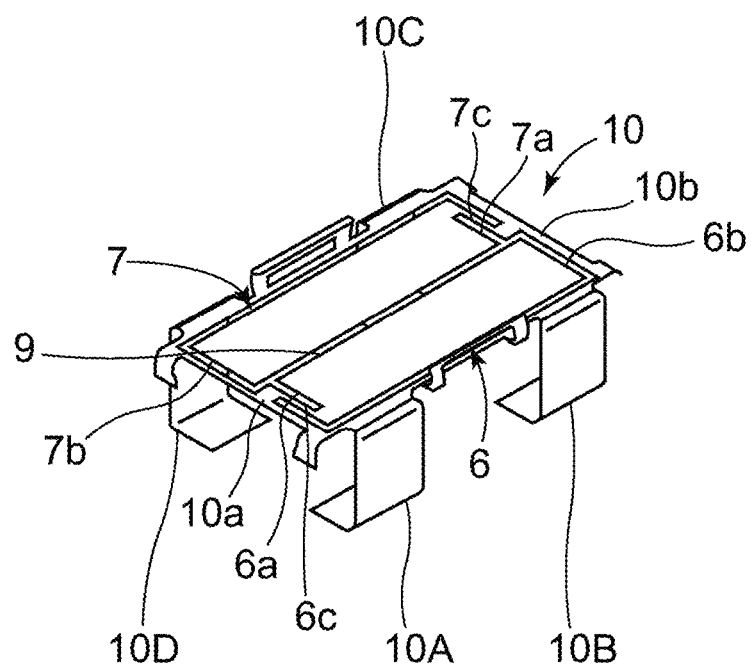
FIG. 3 is a perspective view illustrating a first vibration plate and a second vibration plate of the vibration device according to the first preferred embodiment of the present invention, a support frame connected to the first vibration plate and the second vibration plate, and fixed terminals connected to the first vibration plate or the second vibration plate.
Figure 4:
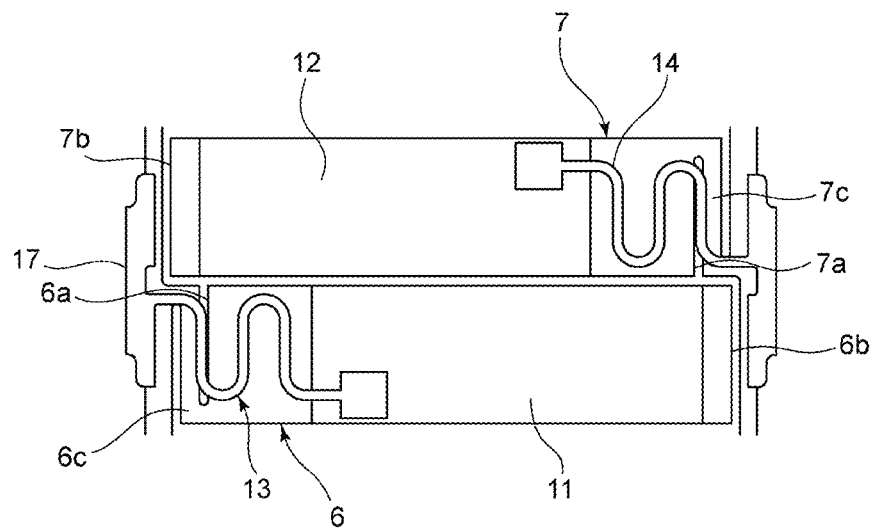
FIG. 4 is a plan view illustrating a main portion of the vibration device in the first preferred embodiment of the present invention.
Figure 5:
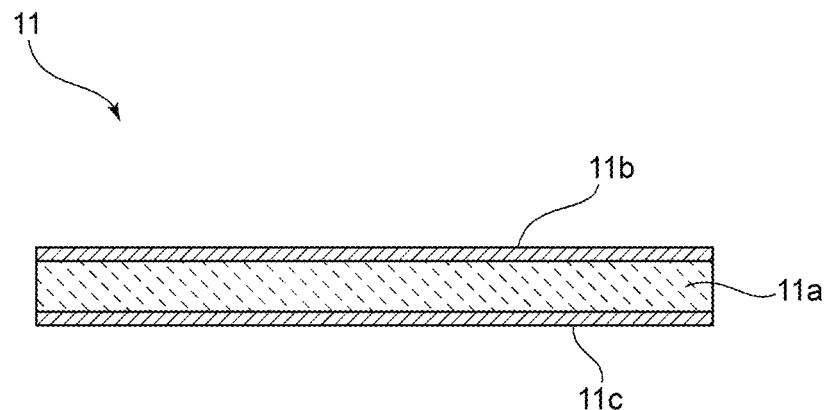
FIG. 5 is an elevational sectional view of a first piezoelectric element used in the first preferred embodiment of the present invention.

FIG. 1 is a perspective view illustrating the exterior of a vibration device according to a first preferred embodiment of the present invention. FIG. 2 is an exploded perspective view of the vibration device according to the first preferred embodiment of the present invention. FIG. 3 is a perspective view illustrating a first vibration plate and a second vibration plate of the vibration device according to the first preferred embodiment, a support frame connected to the first vibration plate and the second vibration plate, and fixed terminals connected to the first vibration plate or the second vibration plate. FIG. 4 is a plan view illustrating a main portion of the vibration device in the first preferred embodiment of the present invention. FIG. 5 is an elevational sectional view of a first piezoelectric element used in the first preferred embodiment.

A vibration device 1 includes a case 2. The case 2 includes a base component 3, a case component 4, which has a rectangular or substantially rectangular frame shape, and a cover component 5. As illustrated in FIG. 2, a first vibration plate 6 and a second vibration plate 7 are provided in an upper opening of the case component 4. The first vibration plate 6 and the second vibration plate 7 are preferably made of a metal such as, for example, stainless steel.

The bottom of the base component 3 of the vibration device 1 is joined to, for example, an external mounting board. As a result, vibrations of the vibration device 1 propagate from the bottom of the base component 3 to the outside.

As illustrated in FIG. 3, the first vibration plate 6 and the second vibration plate 7 are connected to a support portion 10, which has a rectangular frame shape. The support portion 10 includes a plurality of side portions. The support portion 10 includes a first side portion 10a and a second side portion 10b, which are parallel or substantially parallel to each other. The first vibration plate 6 extends from the first side portion 10a toward the second side portion 10b.

The first vibration plate 6 has a length direction. A direction extending from the first side portion 10a toward the second side portion 10b is the length direction of the first vibration plate 6. A direction orthogonal or substantially orthogonal to the length direction of the first vibration plate 6 in plan view is the width direction of the first vibration plate 6. Hereinafter, the terms "length direction" and "width direction" respectively denote the length direction and the width direction of the first vibration plate 6. The first vibration plate 6 includes a first end portion 6a and a bent connection portion 6c at one end in the length direction. The first vibration plate 6 includes a second end portion 6b at another end in the length direction. The first end portion 6a is connected to the first side portion 10a of the support portion 10 via the bent connection portion 6c. The second end portion 6b is a free end. The first vibration plate 6 is supported by the first side portion 10a, and the support structure is a cantilever structure. The first end portion 6a may be connected to the first side portion 10a without the bent connection portion 6c.

The second vibration plate 7 extends from the second side portion 10b toward the first side portion 10a. The second vibration plate 7 includes a first end portion 7a and a bent connection portion 7c at one end in the length direction. The second vibration plate 7 includes a second end portion 7b at another end in the length direction. The first end portion 7a is connected to the second side portion 10b of the support portion 10 via the bent connection portion 7c. The second end portion 7b is a free end. The second vibration plate 7 is supported by the second side portion 10b, and the support structure is a cantilever structure. The first end portion 7a may also be connected to the second side portion 10b without the bent connection portion 7c.

In plan view, the first vibration plate 6 and the second vibration plate 7 are preferably symmetrical or substantially symmetrical with respect to the center point of the frame shape of the support portion 10.

In addition, the support portion 10, which has a rectangular or substantially rectangular frame shape, is preferably integrally provided with fixed terminals 10A to 10D.

The support portion 10, the first vibration plate 6, the second vibration plate 7, and the fixed terminals 10A to 10D are preferably integrally formed with each other from a metal plate.

As illustrated in FIG. 2, a first piezoelectric element 11 and a second piezoelectric element 12 are respectively on the first vibration plate 6 and the second vibration plate 7. FIG. 5 is an elevational sectional view illustrating the first piezoelectric element 11. The first piezoelectric element 11 includes a piezoelectric plate 11a, a first electrode 11b, and a second electrode 11c. In the first piezoelectric element 11, the first electrode 11b is on an upper surface of the piezoelectric plate 11a, and the second electrode 11c is on a lower surface of the piezoelectric plate 11a. The piezoelectric plate 11a is made of, for example, piezoelectric ceramics and is polarized in the thickness direction. The second electrode 11c is joined and electrically connected to the first vibration plate 6.

The first piezoelectric element 11 is expanded and contracted in the in-plane direction by applying an alternating current electric field between the first electrode 11b and the second electrode 11c. In response to this, the first vibration plate 6 is vibrated in a bending mode. As a result, the second end portion 6b, that is, the free end, of the first vibration plate 6 is displaced upward and downward. Similarly, when the second piezoelectric element 12 is driven, the second piezoelectric element 12 is expanded and contracted in the in-plane direction, the second vibration plate 7 is vibrated in a bending mode, and the second end portion 7b, that is, the free end, of the second vibration plate 7 is displaced upward and downward.

A mass addition component 9 is joined to lower surfaces of the first vibration plate 6 and the second vibration plate 7. The mass addition component 9 is preferably made of, for example, a metal, a synthetic material made of a metal and a resin, or ceramics as appropriate. The mass addition component 9 is preferably made of a high-density metal such as, for example, tungsten, which has large mass addition effect. This enables the vibration device 1 to be easily reduced in size. Inclined portions 9b and 9c are provided on an upper surface 9a of the mass addition component 9.

The inclined portion 9b is joined to the first vibration plate 6 at a position closer to the second end portion 6b in the length direction than the center of the first vibration plate 6.

The inclined portion 9c is joined to the second vibration plate 7 at a position closer to the second end portion 7b in the length direction than the center of the second vibration plate 7.

Thus, the mass addition component 9 is fixed at the free ends of the first vibration plate 6 and the second vibration plate 7 and is supported by the first vibration plate 6 and the second vibration plate 7.

The second electrode 11c (see FIG. 5), which is an electrode at a lower surface of the first piezoelectric element 11, is joined to the first vibration plate 6. The first vibration plate 6 is made of a metal, and the second electrode 11c is thus electrically connected to the first vibration plate 6. An electrode at a lower surface of the second piezoelectric element 12 is joined to the second vibration plate 7. The second vibration plate 7 is made of a metal, and the electrode at the lower surface of the second piezoelectric element 12 is thus electrically connected to the second vibration plate 7.

On the other hand, as illustrated in FIGS. 2 and 4, a first conductive wiring line 13 is joined to the first electrode 11b, which is an electrode at an upper surface of the first piezoelectric element 11. The first conductive wiring line 13 is made of an electrically conductive material. The first conductive wiring line 13 is preferably made of a metal. One end portion of the first conductive wiring line 13 is joined to the first electrode 11b of the first piezoelectric element 11. The first conductive wiring line 13 includes a plurality of bent portions and has, for example, a meandering or serpentine shape.

Another end portion of the first conductive wiring line 13 is connected to a first fixed component 17, which is fixed to the base component 3 and the case component 4. The first fixed component 17 is fixed to cover a portion of a side surface of the case component 4. The first conductive wiring line 13 electrically connects the first electrode 11b of the first piezoelectric element 11 and the first fixed component 17.

A second conductive wiring line 14 is joined to an electrode at an upper surface of the second piezoelectric element 12. The second conductive wiring line 14 is made of an electrically conductive material. The second conductive wiring line 14 is preferably made of a metal, for example. One end portion of the second conductive wiring line 14 is joined to the electrode at the upper surface of the second piezoelectric element 12. The second conductive wiring line 14 includes a plurality of bent portions and has, for example, a meandering or serpentine shape. The other end portion of the second conductive wiring line 14 is connected to a second fixed component 17A, which is fixed to the base component 3 and the case component 4. The second fixed component 17A is fixed to cover a portion of a side surface of the case component 4. The second conductive wiring line 14 electrically connects the electrode at the upper surface of the second piezoelectric element 12 and the second fixed component 17A.

Thus, when the first vibration plate 6 and the second vibration plate 7 vibrate, the mass addition component 9, which is fixed to portions of the lower surfaces closer to the free ends of the first vibration plate 6 and the second vibration plate 7, is displaced in an up-down direction.

The first fixed component 17 and the second fixed component 17A are fixed electrodes fixed to the case component 4.

Figure 6A:
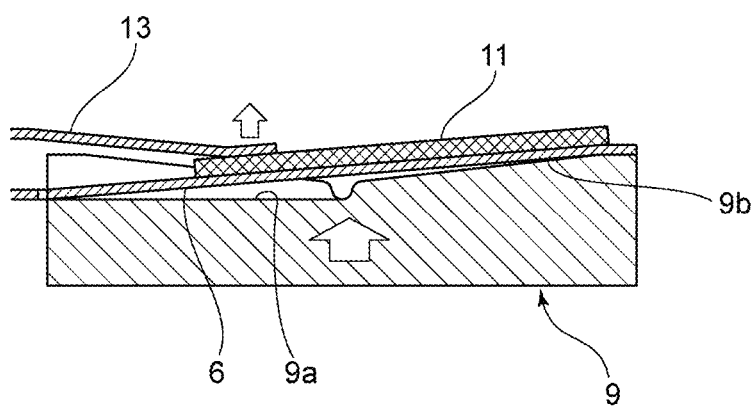
FIG. 6A is a schematic elevational sectional view describing the main portion of the vibration device in the first preferred embodiment of the present invention in a case in which a mass addition component reaches its highest point in the vibration device.
Figure 7A:
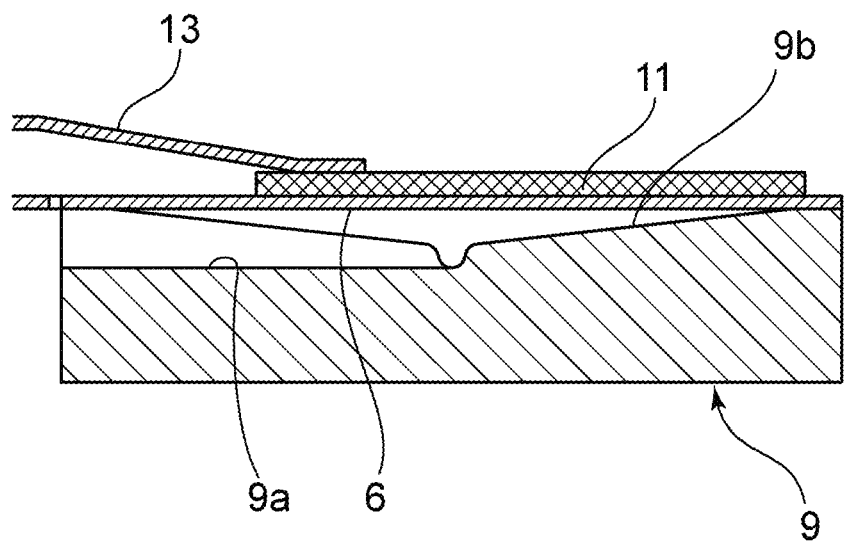
FIG. 7A is a schematic elevational sectional view describing the main portion of the vibration device in the first preferred embodiment of the present invention in a case in which the mass addition component is provided at its neutral point in the vibration device.
Figure 8A:
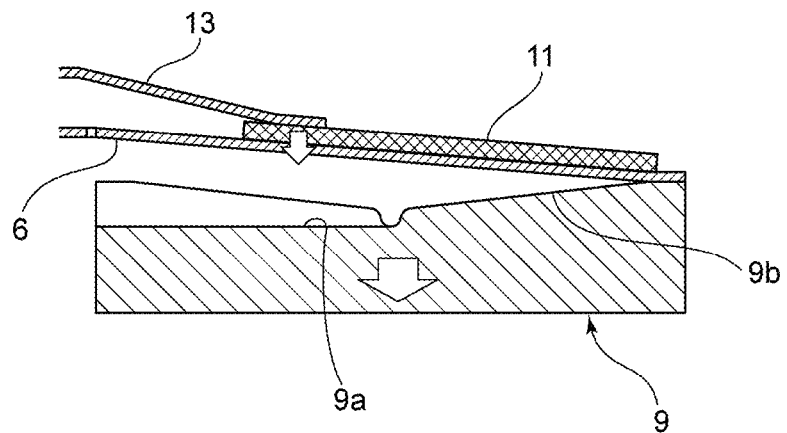
FIG. 8A is a schematic elevational sectional view describing the main portion of the vibration device in the first preferred embodiment of the present invention in a case in which the mass addition component reaches its lowest point in the vibration device.

FIG. 6A is a schematic elevational sectional view describing the main portion of the vibration device in the first preferred embodiment in a case in which a mass addition component reaches its highest point in the vibration device. FIG. 7A is a schematic elevational sectional view describing the main portion of the vibration device in the first preferred embodiment in a case in which the mass addition component exists at its neutral point in the vibration device. FIG. 8A is a schematic elevational sectional view describing the main portion of the vibration device in the first preferred embodiment in a case in which the mass addition component reaches its lowest point in the vibration device.

Here, the term "highest point" denotes the highest position where the second end portion 6b of the first vibration plate 6 exists when the first vibration plate 6 vibrates in the up-down direction. The term "lowest point" denotes the lowest position where the second end portion 6b of the first vibration plate 6 exists when the first vibration plate 6 vibrates in the up-down direction.

Thus, the first vibration plate 6 vibrates, and the mass addition component 9 is displaced in the up-down direction such that the state illustrated in FIG. 6A and the state illustrated in FIG. 8A are cyclically repeated.

Figure 6B:
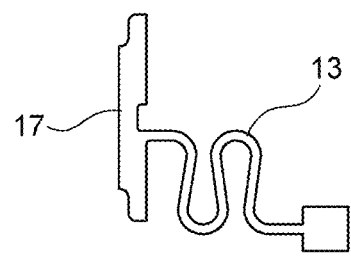
FIG. 6B is a schematic plan view of a terminal in the case in which the mass addition component reaches its highest point in the vibration device in the first preferred embodiment of the present invention.
Figure 7B:
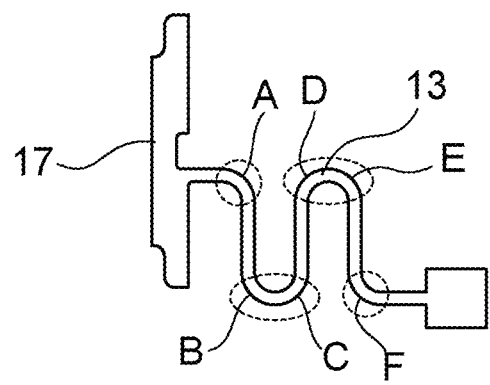
FIG. 7B is a schematic plan view of the terminal in the case in which the mass addition component is provided at its neutral point in the vibration device in the first preferred embodiment of the present invention.
Figure 8B:
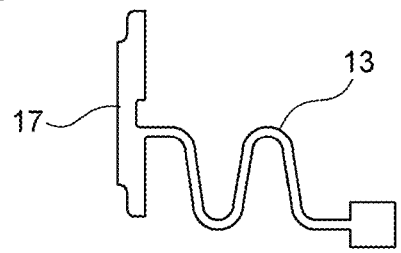
FIG. 8B is a schematic plan view of the terminal in the case in which the mass addition component reaches its lowest point in the vibration device in the first preferred embodiment of the present invention.

FIG. 6B is a schematic plan view of a terminal in the case in which the mass addition component reaches its highest point in the vibration device in the first preferred embodiment. FIG. 7B is a schematic plan view of the terminal in the case in which the mass addition component exists at its neutral point in the vibration device in the first preferred embodiment. FIG. 8B is a schematic plan view of the terminal in the case in which the mass addition component reaches its lowest point in the vibration device in the first preferred embodiment.

As illustrated in FIG. 7B, the first conductive wiring line 13 is defined by a plurality of straight portions parallel or substantially parallel to each other and a plurality of bent portions A to F and has, for example, a meandering or serpentine shape. The first conductive wiring line 13 is bent a plurality of times between the portions thereof extending in the direction orthogonal or substantially orthogonal to the length direction. Thus, the length of the first conductive wiring line 13 is longer than the distance between the first fixed component 17 and the portion where the first conductive wiring line 13 is joined to the first piezoelectric element 11. Accordingly, as illustrated in FIGS. 6B and 8B, deformation of the first conductive wiring line 13 having a meandering or serpentine shape enables absorption of stress applied to the joint portion in the first conductive wiring line 13, which is joined to the first electrode 11b of the first piezoelectric element 11. In particular, it is possible to absorb stress applied, in the length direction, to the joint portion in the first conductive wiring line 13, which is joined to the first electrode 11b of the first piezoelectric element 11.

As a result, even when the first vibration plate 6 vibrates as described above, peeling is unlikely to occur in the joint portion in the first conductive wiring line 13, which is joined to the first electrode 11b of the first piezoelectric element 11. Furthermore, the first conductive wiring line 13 is joined to the first electrode 11b, and the reliability of electrical connection is thus sufficient. In addition, there is no need for a holding portion having a complex structure that holds a piezoelectric element.

Thus, the vibration device 1 is capable of improving the reliability of comfortably joining a terminal and a vibration plate and the reliability of electrical connection therebetween with a simple structure.

Figure 9:
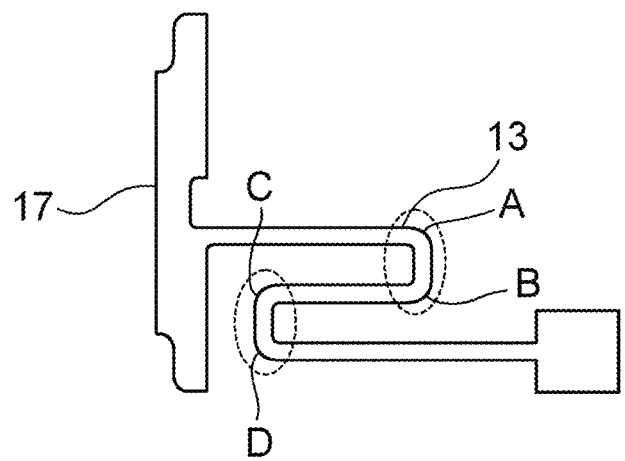
FIG. 9 is a schematic plan view describing a first modification of the meandering or serpentine shape of the terminal.

FIG. 9 is a schematic plan view describing a modification of the meandering or serpentine shape of the terminal. In a first modification of the first conductive wiring line 13 illustrated in FIG. 9, the first conductive wiring line 13 is bent a plurality of times in a direction connecting the tip portion of the first conductive wiring line 13 and the first fixed component 17, that is, in the length direction. Thus, the first conductive wiring line 13 includes a plurality of straight portions parallel or substantially parallel to each other and a plurality of bent portions A to D. In such a manner, the first conductive wiring line 13 may have a meandering or serpentine shape bent a plurality of times in the length direction. In this case, it is possible to increase the length of the first vibration plate 6 in the length direction. Accordingly, it is possible to further reduce the effect of stress in the up-down direction.

Figure 10:
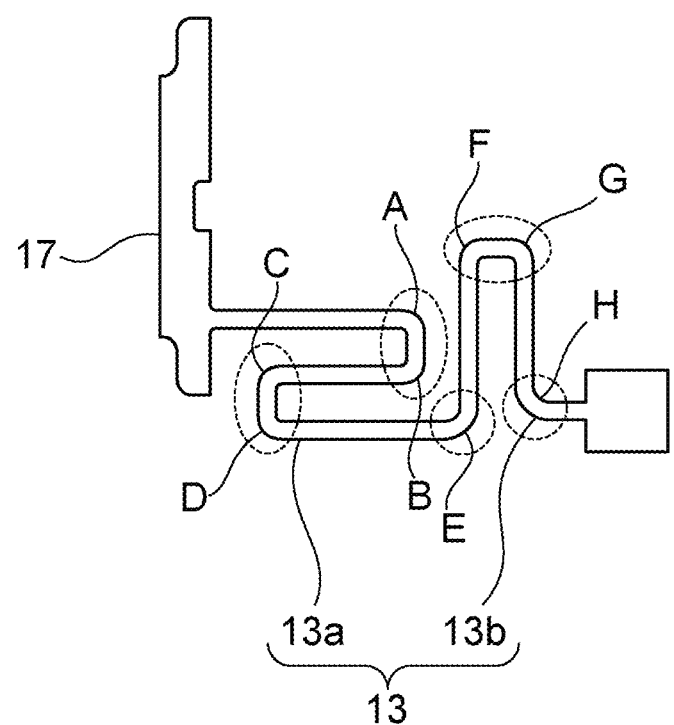
FIG. 10 is a schematic plan view describing a second modification of the meandering or serpentine shape of the terminal.

FIG. 10 is a schematic plan view describing a second modification of the meandering or serpentine shape of the terminal. In the second modification of the first conductive wiring line 13 illustrated in FIG. 10, the first conductive wiring line 13 includes, between the tip portion thereof and the first fixed component 17, a first portion 13a, which is bent a plurality of times in the length direction, and a second portion 13b, which is bent in the width direction orthogonal to the length direction. The first portion 13a includes a plurality of bent portions A to D. The second portion 13b includes a plurality of bent portions E to H. In this case, it is possible to reduce the effect of stress in both the up-down direction and the length direction.

Figure 11:
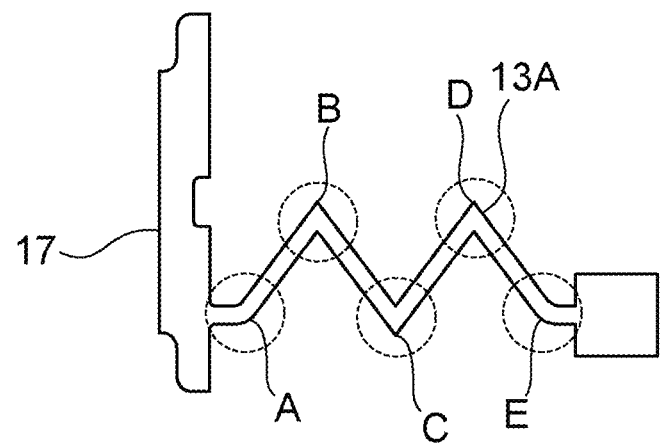
FIG. 11 is a schematic plan view describing a third modification of the shape of the terminal in plan view.

FIG. 11 is a schematic plan view describing a third modification of the shape of the terminal in plan view. In the third modification of the first conductive wiring line 13 illustrated in FIG. 11, a first conductive wiring line 13A includes a plurality of bent portions A to E and has a zigzag shape in plan view. In such a manner, the first conductive wiring line 13A may have a zigzag shape. The effect of absorbing stress in the first conductive wiring line 13A can be achieved as long as the first conductive wiring line 13A includes at least one bent portion. Thus, the number of bent portions may be one, for example. However, a plurality of bent portions are preferably provided. This enables the effect of stress to be more effectively reduced.

Figure 12:
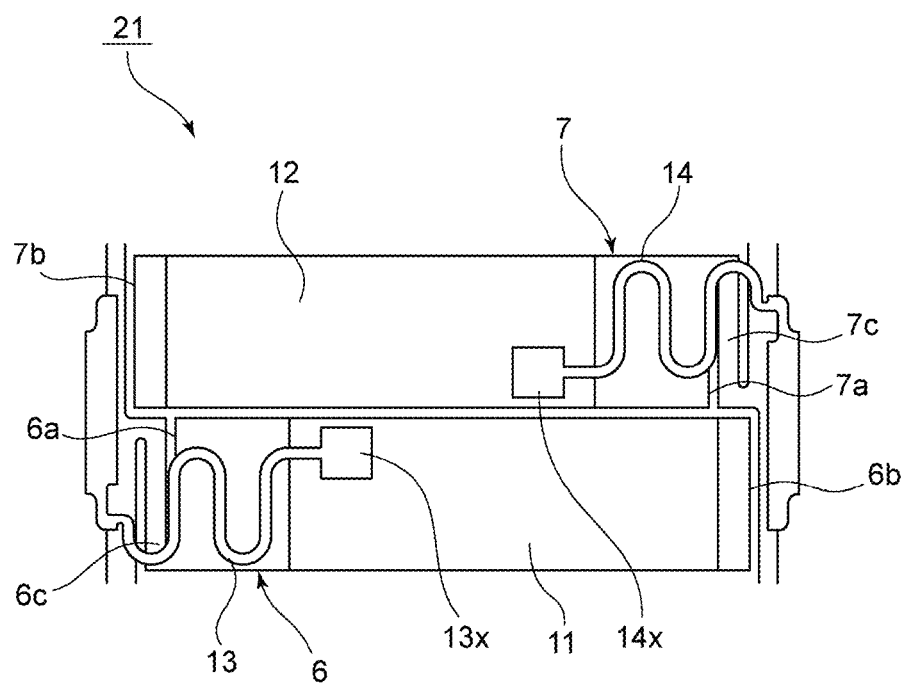
FIG. 12 is a schematic plan view describing a main portion of a vibration device in a second preferred embodiment of the present invention.

FIG. 12 is a schematic plan view describing a main portion of a vibration device according to a second preferred embodiment of the present invention. In a vibration device 21 in the second preferred embodiment, a joint portion 13x in the first conductive wiring line 13, which is joined to the first electrode 11b of the first piezoelectric element 11, is positioned closer to the second vibration plate 7 in the width direction of the first vibration plate 6. Similarly, a joint portion 14x in the second conductive wiring line 14, which is joined to the electrode at the upper surface of the second piezoelectric element 12, is positioned closer to the first vibration plate 6 in the width direction of the second vibration plate 7. In such a manner, the joint portions 13x and 14x may be positioned closer to a portion where the first vibration plate 6 and the second vibration plate 7 are adjacent to each other. In this case, it is possible to further reduce the effect of stress on the joint portions 13x and 14x.

The joint portions 13x and 14x may be respectively positioned closer to the center of the first vibration plate 6 and the center of the second vibration plate 7 in the width direction.

Figure 13A:
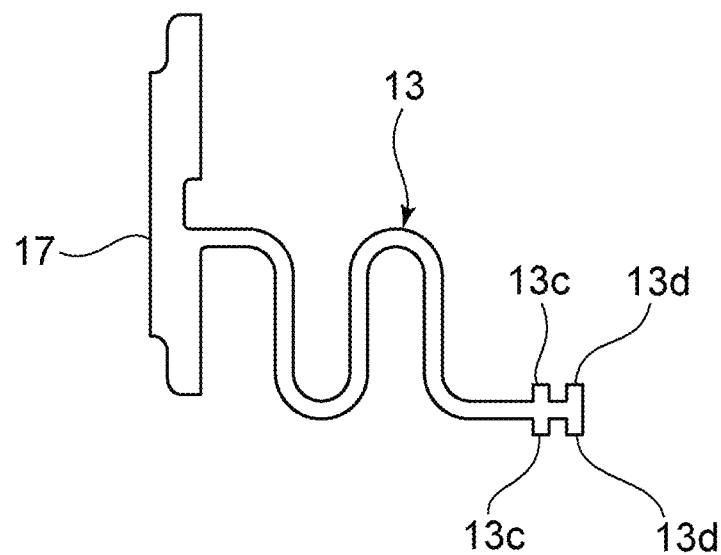
FIG. 13A is a schematic plan view describing a joint portion between a terminal and an electrode of a piezoelectric element in a vibration device in a third preferred embodiment of the present invention.
Figure 13B:
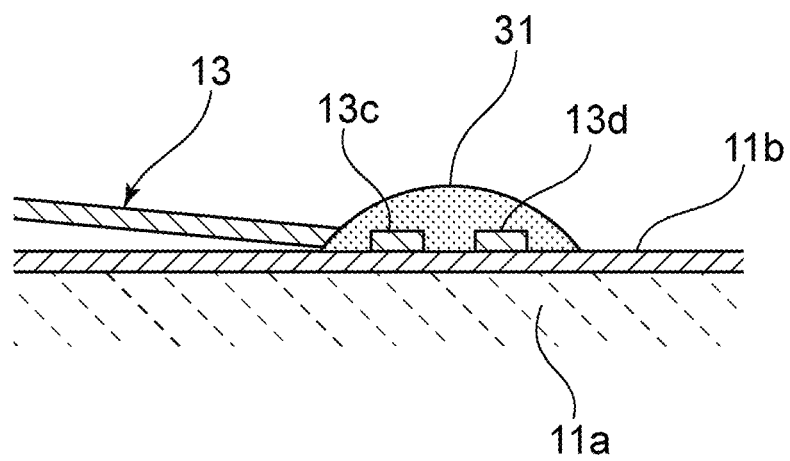
FIG. 13B is an elevational sectional view of the joint portion.

FIG. 13A is a schematic plan view describing a joint portion between a terminal and an electrode of a piezoelectric element in a vibration device according to a third preferred embodiment of the present invention. FIG. 13B is an elevational sectional view of the joint portion.

The first conductive wiring line 13 is joined, at the joint portion, to the first electrode 11b of the first piezoelectric element 11 with solder 31. Here, a plurality of projections 13c and 13d are provided at the joint portion in the first conductive wiring line 13 in a direction intersecting the direction in which the first conductive wiring line 13 extends. The projections 13c and 13d are provided at both sides in the direction orthogonal or substantially orthogonal to the direction in which the first conductive wiring line 13 extends. Thus, even when stress is applied to the first conductive wiring line 13 in the direction in which the first conductive wiring line 13 extends, that is, in the length direction, the anchor effect caused by the projections 13c and 13d can more effectively prevent, for example, peeling due to the stress.

The projections 13c and 13d do not have to be orthogonal or substantially orthogonal to the direction in which the first conductive wiring line 13 extends. The projections 13c and 13d may extend in a direction intersecting, at an angle other than 90 degrees, the direction in which the first conductive wiring line 13 extends.

Figure 14:
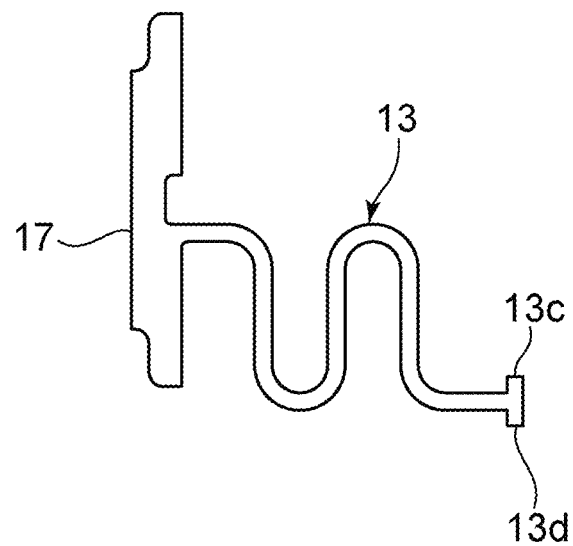
FIG. 14 is a schematic plan view describing a first modification of the third preferred embodiment of the present invention.

FIG. 14 is a schematic plan view describing a first modification of the third preferred embodiment of the present invention. Here, the projections 13c and 13d are provided, in the width direction orthogonal or substantially orthogonal to the direction in which the first conductive wiring line 13 extends, at the joint portion in the first conductive wiring line 13, which is one end portion of the first conductive wiring line 13.

Figure 15:
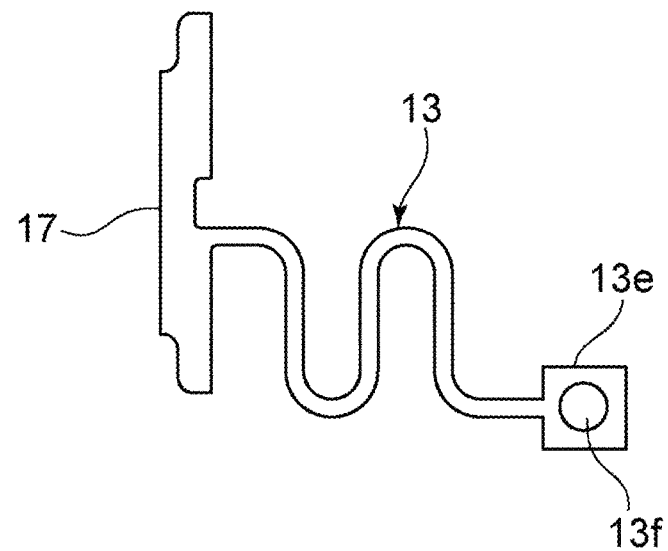
FIG. 15 is a schematic plan view describing a second modification of the third preferred embodiment of the present invention.

FIG. 15 is a schematic plan view describing a second modification of the third preferred embodiment of the present invention. A joint portion 13e in the first conductive wiring line 13 has a rectangular or substantially rectangular shape whose length in the width direction is larger than that of the portion of the first conductive wiring line 13 other than the joint portion 13e. A through hole 13f is provided in the joint portion 13e so as to be positioned at the center or approximate center of the rectangular shape.

The joint portion 13e, which has a rectangular or substantially rectangular shape and includes side portions extending in the width direction, is provided, and peeling is thus unlikely to occur in the joint portion 13e due to the anchor effect. The anchor effect is also exerted on the portion where the through hole 13f is provided. Accordingly, peeling is more unlikely to occur in the joint portion. The through hole 13f may not be provided.

As illustrated in FIGS. 13 to 15, the disposition of a portion extending in the direction intersecting the length direction at the joint portion in the first conductive wiring line 13 enables the joint portion to be more resistant to tensile loads applied in the up-down direction and the length direction due to the anchor effect.

In the first preferred embodiment, a plurality of vibration plates, that is, the first vibration plate 6 and the second vibration plate 7, are provided. However, the present invention can also be applied to a vibration device in which a single vibration plate is provided. In addition, the present invention can be applied to a vibration device including three or more vibration plates.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
    a first vibration plate having a length direction, the first vibration plate including a first end portion at one end in the length direction and a second end portion at another end in the length direction;
    a first piezoelectric element on the first vibration plate;
    a first conductive wiring line joined to the first piezoelectric element at a position closer to the first end portion in the length direction than a center of the first vibration plate;
    a first fixed component connected to the first conductive wiring line; and
    a case component to which the first fixed component is fixed; wherein
    the second end portion is a free end; and
    the first conductive wiring line includes a bent portion.

2. The vibration device according to claim 1, wherein the first conductive wiring line includes a plurality of the bent portions.

3. The vibration device according to claim 1, wherein the first conductive wiring line has a meandering or serpentine shape.

4. The vibration device according to claim 1, wherein the first conductive wiring line has a zigzag shape.

5. The vibration device according to claim 1, further comprising a mass addition component joined to the first vibration plate at a position closer to the second end portion in the length direction than the center of the first vibration plate.

6. The vibration device according to claim 5, further comprising:
    a second vibration plate including a first end portion at one end in the length direction and a second end portion at another end in the length direction;
    a second piezoelectric element on the second vibration plate;
    a second conductive wiring line joined to the second piezoelectric element at a position to the first end portion in the length direction than a center of the second vibration plate; and
    a second fixed component connected to the second conductive wiring line, the second fixed component being fixed to the case component; wherein
    the case component includes a first side portion and a second side portion that oppose each other, the first vibration plate being connected to the first side portion, the second vibration plate being connected to the second side portion; and
    the mass addition component is joined to the second vibration plate.

7. The vibration device according to claim 6, wherein the first vibration plate and the second vibration plate are provided in an upper opening of the case component.

8. The vibration device according to claim 7, wherein the first vibration plate and the second vibration plate are symmetrical or substantially symmetrical about a center pointed of the vibration device.

9. The vibration device according to claim 5, wherein inclined portions are provided on an upper surface of the mass addition component.

* * * * *